(12) United States Patent
Maeng et al.

(10) Patent No.: US 8,912,536 B2
(45) Date of Patent: Dec. 16, 2014

(54) TRANSISTORS, METHODS OF MANUFACTURING THE SAME AND ELECTRONIC DEVICES INCLUDING TRANSISTORS

(75) Inventors: Wan-joo Maeng, Yongin-si (KR); Myung-kwan Ryu, Yongin-si (KR); Tae-sang Kim, Seoul (KR); Joon-seok Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 13/156,906

(22) Filed: Jun. 9, 2011

(65) Prior Publication Data

US 2012/0126223 A1    May 24, 2012

(30) Foreign Application Priority Data

Nov. 19, 2010   (KR) .................. 10-2010-0115765
Dec. 29, 2010   (KR) .................. 10-2010-0138043

(51) Int. Cl.
*H01L 29/10*    (2006.01)
*H01L 29/786*   (2006.01)

(52) U.S. Cl.
CPC .................. *H01L 29/7869* (2013.01)
USPC ............. 257/43; 257/E29.296; 438/104

(58) Field of Classification Search
USPC ....................................... 257/43
See application file for complete search history.

(56) References Cited

U.S. PATENT DOCUMENTS

2008/0315200 A1* 12/2008 Kim et al. .......... 257/57
2010/0001272 A1   1/2010 Ye
2010/0093137 A1*  4/2010 Chen ............... 438/151

FOREIGN PATENT DOCUMENTS

KR    1995-0002059 A    1/1995
KR    2009-0124329 A    12/2009

OTHER PUBLICATIONS

Kim et al., "Amorphous hafnium-indium-zinc oxide semiconductor thin film transistors," Appl. Phys. Lett. 95, 252103 (2009); http://dx.doi.org/10.1063/1.3275801.*
Park et al., "Highly Stable Transparent Amorphous Oxide Semiconductor Thin-Film Transistors Having Double-Stacked Active Layers," Adv. Mater. 2010, 22, 5512-5516.*
Son et al., "Threshold Voltage Control of Amorphous Gallium Indium Zinc Oxide TFTs by Suppressing Back-Channel Current," Electrochem. and Solid-State Lett., 12, 1, H26-H28, 2009.*
Whelan et al., "A Comparison of Channel Indium Content in Low Noise Metamorphic HEMTs with InxGa1-xAs (0.3<X=0.6);" Indium Phosphide and Related Materials, 2000. Conference Proceedings. 2000 International Conference on, 2000 pp. 349-352.

* cited by examiner

*Primary Examiner* — Colleen A Matthews
*Assistant Examiner* — Christopher Johnson
(74) *Attorney, Agent, or Firm* — Harness, Dickey & Pierce, P.L.C.

(57) ABSTRACT

An oxide transistor includes: a channel layer formed of an oxide semiconductor; a source electrode contacting a first end portion of the channel layer; a drain electrode contacting a second end portion of the channel layer; a gate corresponding to the channel layer; and a gate insulating layer disposed between the channel layer and the gate. The oxide semiconductor includes hafnium-indium-zinc-oxide (HfInZnO). An electrical conductivity of a back channel region of the channel layer is lower than an electrical conductivity of a front channel region of the channel layer.

28 Claims, 12 Drawing Sheets

< COMPARATIVE EXAMPLE 1 >

< COMPARATIVE EXAMPLE 2 >

TRANSISTORS, METHODS OF MANUFACTURING THE SAME AND ELECTRONIC DEVICES INCLUDING TRANSISTORS

CROSS-REFERENCE TO RELATED APPLICATION(S)

This application claims priority under 35 U.S.C. §119 to Korean Patent Application No. 10-2010-0115765, filed on Nov. 19, 2010, and Korean Patent Application No. 10-2010-0138043, filed on Dec. 29, 2010, in the Korean Intellectual Property Office, the disclosures of which are incorporated herein in their entirety by reference.

BACKGROUND

1. Field

Example embodiments relate to transistors, methods of manufacturing the same, and electronic devices including transistors.

2. Description of the Related Art

Transistors are used as switching devices and driving devices in electronic devices. Because thin film transistors (TFTs) may be formed on glass substrates or plastic substrates, they are used in flat panel display apparatuses, such as liquid crystal display (LCD) devices, organic light emitting display (OLED) devices, and the like.

To improve operating characteristics of TFTs, channel layers may be formed as oxide layers with relatively high carrier mobility. Conventionally, however, characteristics of these transistors may not be maintained constant or substantially constant because oxide layers are relatively sensitive to their external environment, such as light or moisture, and have relatively low thermal stability.

SUMMARY

Example embodiments provide transistors having improved performance and/or suppressed characteristic changes due to an external environment. Example embodiments also provide methods of manufacturing the transistors and electronic devices including transistors.

Additional aspects will be set forth in part in the description which follows and, in part, will be apparent from the description, or may be learned by practice of the example embodiments.

At least one example embodiment provides an oxide transistor including: a channel layer including an oxide semiconductor; a source electrode contacting a first end portion of the channel layer; a drain electrode contacting a second end portion of the channel layer; a gate corresponding to the channel layer; and a gate insulating layer disposed between the channel layer and the gate. The channel layer includes hafnium-indium-zinc-oxide (HfInZnO), and an electrical conductivity of a back channel region of the channel layer is lower than electrical conductivity of a front channel region of the channel layer.

According to at least some example embodiments, a carrier concentration of the back channel region may be lower than a carrier concentration of the front channel region.

According to at least some example embodiments, the back channel region and the front channel region may have different composition ratios. For example, the back channel region and the front channel region may have different metal composition ratios.

An In content of the back channel region may be less than an In content of the front channel region. In a more specific example, the In content of the back channel region may be between about 10 at % and about 30 at %, inclusive, based on metallic components of the back channel region.

A Hf content of the back channel region may be greater than a Hf content of the front channel region. In one example, the Hf content of the back channel region may be between about 3 at % and about 20 at %, inclusive, based on metallic components of the back channel region.

The back channel region may have a thickness of between about 1 nm and about 40 nm, inclusive.

According to at least some example embodiments, the gate may be disposed above or below the channel layer. The oxide transistor may further include an etch stop layer disposed on the channel layer.

According to at least one other example embodiment, a flat panel display apparatus includes an oxide transistor. The oxide transistor includes: a channel layer including an oxide semiconductor; a source electrode contacting a first end portion of the channel layer; a drain electrode contacting a second end portion of the channel layer; a gate corresponding to the channel layer; and a gate insulating layer disposed between the channel layer and the gate. The channel layer includes hafnium-indium-zinc-oxide (HfInZnO), and an electrical conductivity of a back channel region of the channel layer is lower than electrical conductivity of a front channel region of the channel layer. The flat display apparatus may be a liquid crystal display (LCD) device, an organic light emitting display (OLED) device, or the like. The transistor may be a switching device or a driving device of the flat panel display.

At least one other example embodiment provides a method of manufacturing an oxide transistor. According to at least this example embodiment, the method includes: forming a gate on a substrate; forming a gate insulating layer to cover the gate; forming a channel layer on the gate insulating layer; and forming a source electrode to contact a first end portion of the channel layer, and a drain electrode to contact a second end portion of the channel layer. The forming of the channel layer includes: forming a first material layer and a second material layer sequentially on the gate insulating layer. The first material layer includes hafnium-indium-zinc-oxide (HfInZnO) and has a first electrical conductivity. The second material layer includes hafnium-indium-zinc-oxide (HfInZnO) and has a second electrical conductivity. The second electrical conductivity is lower than the first electrical conductivity.

According to at least some example embodiments, the first material layer and the second material layer may have different composition ratios. For example, the first material layer and the second material layer may have different metal composition ratios.

An In content of the second material layer may be less than an In content of the first material layer and/or a Hf content of the second material layer may be greater than a Hf content of the first material layer. The second material layer may be formed to have a thickness of between about 1 nm and about 40 nm, inclusive.

According to at least some example embodiments, the method may further include: forming an etch stop layer on the channel layer and/or annealing the channel layer at a temperature of between about 250° C. and about 400° C., inclusive.

At least one other example embodiment provides a method of manufacturing an oxide transistor. According to at least this example embodiment, the method includes: forming a channel layer on a substrate; forming a source electrode to contact a first end portion of the channel layer, and a drain electrode to contact a second end portion of the channel layer; forming a gate insulating layer to cover the channel layer, the source electrode, and the drain electrode; and forming a gate on the gate insulating layer. The forming of the channel layer includes: forming a first material layer and a second material layer sequentially on the substrate. The first material layer includes hafnium-indium-zinc-oxide (HfInZnO) and has a first electrical conductivity. The second material layer includes hafnium-indium-zinc-oxide (HfInZnO) and has a second electrical conductivity. The second electrical conductivity is greater than the first electrical conductivity.

According to at least some example embodiments, the first material layer and the second material layer may have different composition ratios (e.g., different metal composition ratios).

An In content of the first material layer may be less than an In content of the second material layer. A Hf content of the first material layer may be greater than a Hf content of the second material layer.

The first material layer may be formed to have a thickness of between about 1 nm and about 40 nm, inclusive.

The method may further include: annealing the channel layer at a temperature of between about 250° C. and about 400° C., inclusive.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
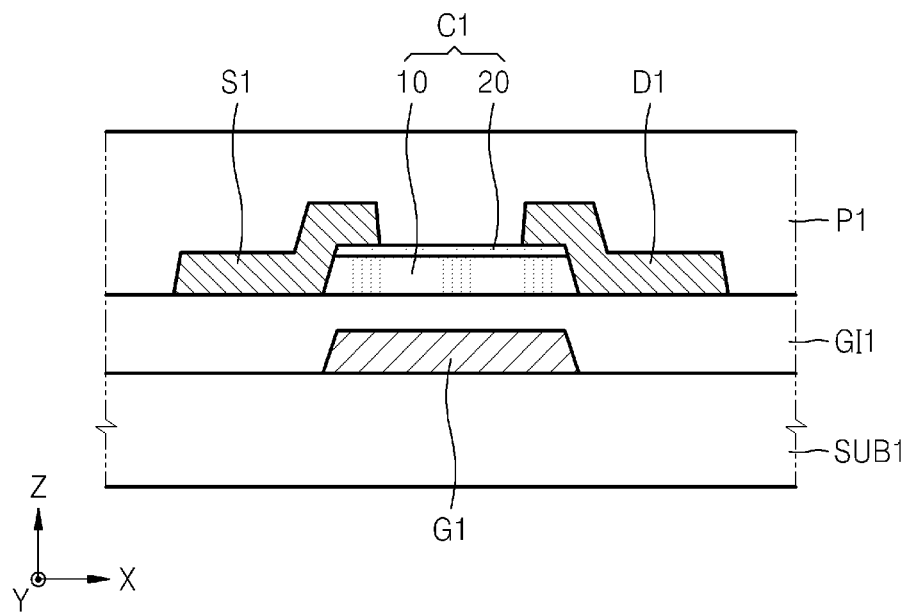
FIGS. 1 through 3 are cross-sectional views of transistors according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments of transistors, methods of manufacturing transistors, and electronic devices including transistors will be described with reference to the attached drawings. In the drawings, the thicknesses of layers and regions are exaggerated for clarity. Like reference numerals in the drawings denote like elements.

FIG. 1 is a cross-sectional view of a transistor according to an example embodiment. The transistor shown in FIG. 1 is a bottom gate-type transistor in which a gate G1 is disposed below a channel layer C1.

Referring to FIG. 1, the gate G1 is formed on a substrate SUB1. The substrate SUB1 may be a glass substrate, a plastic substrate, a silicon substrate, or any other substrate used to manufacture a semiconductor device. The gate G1 may be formed of an electrode material (e.g., a metal, a conductive oxide, or the like).

A gate insulating layer GI1 is formed on the substrate SUB1 to cover the gate G1. The gate insulating layer GI1 may be a silicon oxide layer, a silicon oxynitride layer, a silicon nitride layer, or another material layer such as a high-k dielectric material layer having a dielectric constant higher than the silicon nitride layer. The gate insulating layer GI1 may have a stack structure including at least two of the silicon oxide layer, the silicon oxynitride layer, the silicon nitride layer, and the high-k dielectric material layer.

A channel layer C1 is disposed on the gate insulating layer GI1. In this example, the channel layer C1 is disposed above the gate G1 and a width of the channel layer C1, which is measured along an X-axis direction, is similar to a width of the gate G1, which is also measured along the X-axis direction. However, in alternative example embodiments, the width of the channel layer C1 may be greater than or less than the width of the gate G1. The channel layer C1 may include an oxide semiconductor, for example, a ZnO-based oxide semiconductor. In a more specific example, the channel layer C1 may be formed of hafnium-indium-zinc-oxide (HfInZnO). However, alternative example embodiments may include gallium-indium-zinc-oxide (GaInZnO), yttrium-indium-zinc-oxide (YInZnO), tantalum-indium-zinc-oxide (TaInZnO), or the like.

Still referring to FIG. 1, the channel layer C1 includes a front channel region 10 and a back channel region 20. The front channel region 10 is disposed closer to the gate G1 than the back channel region 20. In FIG. 1, the back channel region 20 is formed at an upper surface portion of the channel layer C1, whereas the remaining portion of the channel layer C1 forms the front channel region 10.

Characteristics of the front channel region 10 may differ from those of the back channel region 20. For example, electrical conductivity of the back channel region 20 may be lower than that of the front channel region 10 because a carrier concentration of the back channel region 20 may be lower than that of the front channel region 10. In one example, the carrier concentration difference between the front channel region 10 and the back channel region 20 may be a result of a composition ratio difference between the front channel region 10 and the back channel region 20. In this example embodiment, the composition ratio refers to a metal composition ratio.

According to at least some example embodiments, an amount (content) of an element functioning as a donor in a metallic component of the back channel region 20 is less than that of the front channel region 10. In addition, an amount (content) of an element functioning as an acceptor in a metallic component of the back channel region 20 is greater than that of the front channel region 10. When the channel layer C1 is formed of HfInZnO, indium (In) functions as a donor, whereas hafnium (Hf) functions as an acceptor. Thus, in this example, the In content of the back channel region 20 is less than that of the front channel region 10, whereas a Hf content of the back channel region 20 is greater than that of the front channel region 10. In a more specific example, the In content of the back channel region 20 may be between about 10 at % and about 30 at %, inclusive. The Hf content of the back channel region 20 may be between about 3 at % and about 20 at %, inclusive, based on metallic components of the back channel region 20. A zinc (Zn) content of the back channel region 20 may be between about 50 at % and about 87 at %, inclusive, based on the metallic components of the back channel region 20. In this case, the In content is given by $[\text{In}/(\text{Hf}+\text{In}+\text{Zn})]\times 100$, the Hf content is given by $[\text{Hf}/(\text{Hf}+\text{In}+\text{Zn})]\times 100$, and the Zn content is given by $[\text{Zn}/(\text{Hf}+\text{In}+\text{Zn})]\times 100$.

According to at least some example embodiments, an In content of the front channel region 10 may be greater than that of the back channel region 20, and a Hf content of the front channel region 10 may be less than that of the back channel region 20. A thickness of the front channel region 10 may be between about 10 nm and about 100 nm, inclusive. A thickness of the back channel region 20 may be between about 1 nm and about 40 nm, inclusive. In a more specific example, the thickness of the back channel region 20 may be between about 1 and about 20 nm, inclusive.

According to at least some example embodiments, the thickness of the front channel region 10 may be greater than that of the back channel region 20. And, a composition ratio (a metallic composition ratio) of the back channel region 20 may be different from a composition ratio of the front channel region 10. Accordingly, the electrical characteristics of the front channel region 10 and the back channel region 20 may differ, thereby improving the reliability, stability and/or performance of a transistor, as is described below in more detail with reference to experimental data.

Referring back to FIG. 1, a source electrode S1 is disposed on the gate insulating layer GI1 and contacts a first end or outer portion of the channel layer C1. A drain electrode D1 is disposed on the gate insulating layer GI1 and contacts a second end or outer portion of the channel layer C1. In more detail, the source electrode S1 is formed on an upper surface of the gate insulating layer G11, a sidewall of the channel layer C1 and an upper surface of the first end or outer portion of the channel layer C1. The drain electrode D1 is formed on an upper surface of the gate insulating layer G11, a sidewall of the channel layer C1 and an upper surface of the second end or outer portion of the channel layer C1.

The source electrode S1 and the drain electrode D1 may have a single layer or multi-layer structure. The source electrode S1 and the drain electrode D1 may be formed of the same or substantially the same material as the gate G1. Alternatively, however, the source electrode S1 and the drain electrode D1 may be formed of a different material than the gate G1.

Referring still to FIG. 1, a passivation layer P1 is disposed on the gate insulating layer GI1 to cover the channel layer C1, the source electrode S1, and the drain electrode D1. The passivation layer P1 may be, for example, a silicon oxide layer, a silicon oxynitride layer, a silicon nitride layer, an organic layer, or may have a stack structure including at least two of the silicon oxide layer, the silicon oxynitride layer, the silicon nitride layer, and the organic layer.

The gate G1 may have a thickness between about 50 nm and about 300 nm, inclusive. The gate insulating layer GI1 may have a thickness between about 50 nm and about 400 nm, inclusive. The source electrode S1 may have a thickness between about 10 nm and about 200 nm, inclusive. The drain electrode D1 may have a thickness between about 10 nm and about 200 nm, inclusive. The passivation layer P1 may have a thickness between about 50 nm and about 1200 nm, inclusive. However, the thicknesses may vary in alternative example embodiments.

Figure 2:
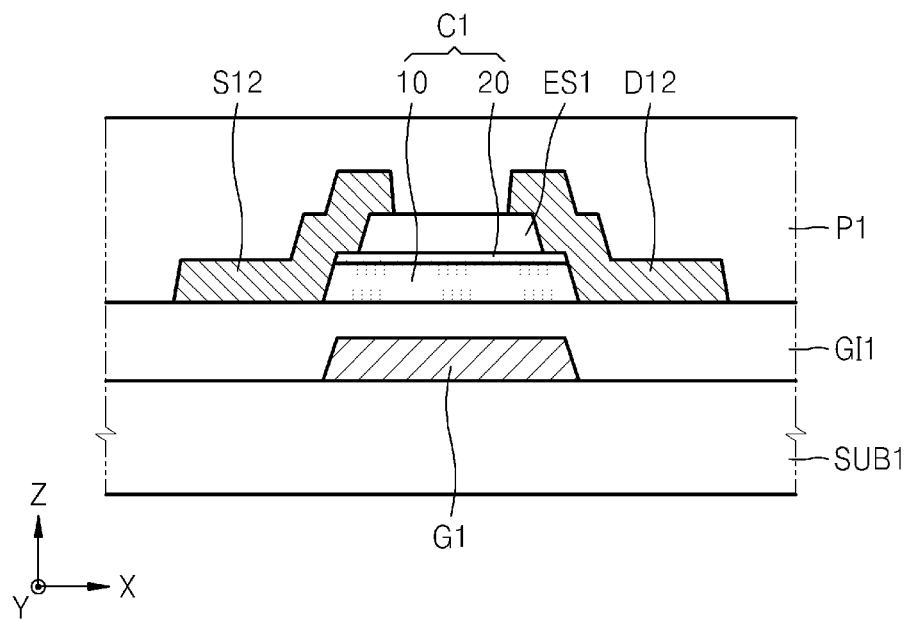

FIG. 2 illustrates a transistor according to another example embodiment. The transistor shown in FIG. 2 is similar to the transistor shown in FIG. 1. Thus, repetitive discussions regarding similar components will not be provided.

Referring to FIG. 2, the transistor further includes an etch stop layer ES1 disposed on the channel layer C1. In this example embodiment, a width of the etch stop layer ES1, which is measured along an X-axis direction, is less than the width of the channel layer C1. As shown, first and second end or outer portions of the channel layer C1 are not covered by the etch stop layer ES1.

The source electrode S12 is similar to the source electrode S1 in FIG. 1, but is formed on an upper surface of the gate insulating layer G11, the sidewall and an upper surface of a first end or outer portion of the channel layer C1, and a sidewall and upper surface of a first end or outer portion of the etch stop layer ES1. The drain electrode D12 is similar to the drain electrode D1 in FIG. 1, but is formed on an upper surface of the gate insulating layer GI1, the sidewall and an upper surface of the second end or outer portion of the channel layer C1, and a sidewall and upper surface of a second end or outer portion of the etch stop layer ES1.

According to at least this example embodiment, the etch stop layer ES1 may suppress and/or prevent the channel layer C1 from being damaged during an etching operation for forming the source electrode S12 and the drain electrode D12. The etch stop layer ES1 may include, for example, a silicon oxide, a silicon nitride, an organic insulation material, or the like. Whether the etch stop layer ES1 is used may be determined according to a material of the channel layer C1 and materials of the source electrode and the drain electrode.

Figure 3:
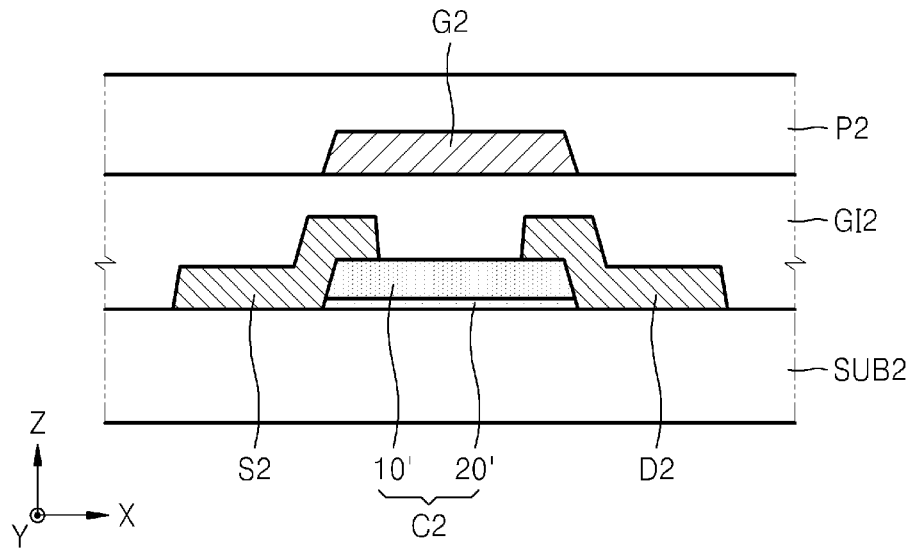

FIG. 3 is a cross-sectional view of a transistor according to another example embodiment. The transistor shown in FIG. 3 is a top gate-type transistor in which a gate G2 is disposed above a channel layer C2.

Referring to FIG. 3, the channel layer C2 is disposed on a substrate SUB2. The channel layer C2 is similar to an inverse structure of the channel layer C1 of FIG. 1. In this example, a back channel region 20' is formed in a lower surface portion of the channel layer C2, whereas the remaining portions of the channel layer C2 serve as the front channel region 10'. In this example, the back channel region 20' and the front channel region 10' are sequentially stacked on the substrate SUB2. In FIG. 3, the front channel region 10' is disposed closer to the gate G2 than the back channel region 20'.

Because the materials, characteristics and/or composition ratio of the front channel region 10' and the back channel region 20' are similar to or the same as those of the front channel region 10 and the back channel region 20 described with reference to FIG. 1, a detailed description thereof is omitted.

Still referring to FIG. 3, a source electrode S2 is disposed on the substrate SUB2 and contacts a first end or outer portion of the channel layer C2. A drain electrode D2 is disposed on the substrate SUB2 and contacts a second end or outer portion of the channel layer C2. In more detail, the source electrode S2 is formed on an upper surface of the substrate SUB2, a sidewall of the channel layer C2 and an upper surface of the first end or outer portion of the channel layer C2. The drain electrode D2 is formed on an upper surface of the substrate SUB2, a sidewall of the channel layer C2 and an upper surface of the second end or outer portion of the channel layer C2.

A gate insulating layer G12 is disposed to cover the channel layer C2, the source electrode S2, and the drain electrode D2. The gate G2 is disposed on the gate insulating layer G12 above the channel layer C2. In FIG. 3, the gate G2 has substantially the same width as the channel layer C2. In alternative example embodiments, however, the width of the gate G2 may be greater than or less than the width of the channel layer C2.

A passivation layer P2 is disposed on the gate insulating layer G12 to cover the gate G2. Materials and thicknesses of the substrate SUB2, the source electrode S2, the drain electrode D2, the gate insulating layer G12, the gate G2 and the passivation layer P2 of FIG. 3 may be similar to or the same as those of the substrate SUB1, the source electrode S1, the drain electrode D1, the gate insulating layer GI1, the gate G1 and the passivation layer P1 of FIG. 1, respectively.

Figure 4:
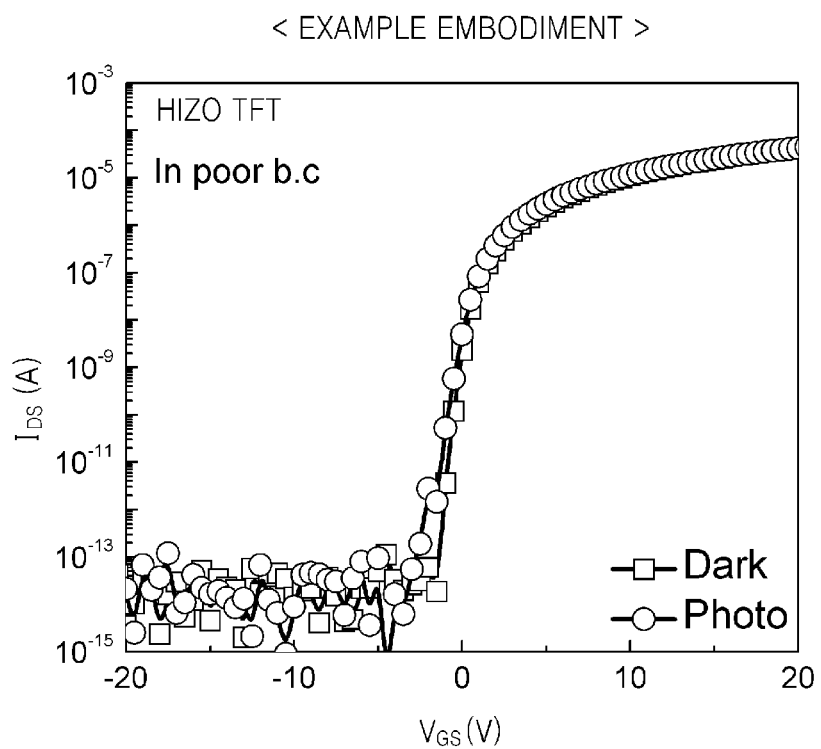
FIG. 4 is a graph illustrating example gate voltage ($V_{GS}$)–drain current ($I_{DS}$) characteristics of a transistor before and after light is irradiated on the transistor according to an example embodiment.

FIG. 4 is a graph of drain current ($I_{DS}$) versus gate voltage ($V_{GS}$) illustrating example characteristics of an example embodiment of a transistor before and after light is irradiated on the transistor. The transistor used to obtain the graph shown in FIG. 4 is substantially the same as the transistor described above with regard to FIG. 2. In this example, the channel layer C1 is formed of HfInZnO, and compositions of the front channel region 10 and the back channel region 20 are shown in Table 1. In addition, the transistor used to obtain the graph shown in FIG. 4 was annealed at a temperature of about 250° C. In FIG. 4, 'Dark' indicates a case where light is not irradiated on the transistor, whereas 'Photo' indicates a case where light of about 2000 lux is irradiated on the transistor.

TABLE 1

| Embodiment | In content (at %) | Hf content (at %) | Zn content (at %) |
| --- | --- | --- | --- |
| Front channel (standard) | 35 | 10 | 55 |
| Back channel (In poor) | 25 | 10 | 65 |

Referring to FIG. 4, a plot for the case (Photo) where light is irradiated on the transistor and a plot for the case (Dark) where light is not irradiated on the transistor are substantially the same, which indicates that characteristics of the transistor remain substantially unchanged by the irradiated light.

Figure 5:
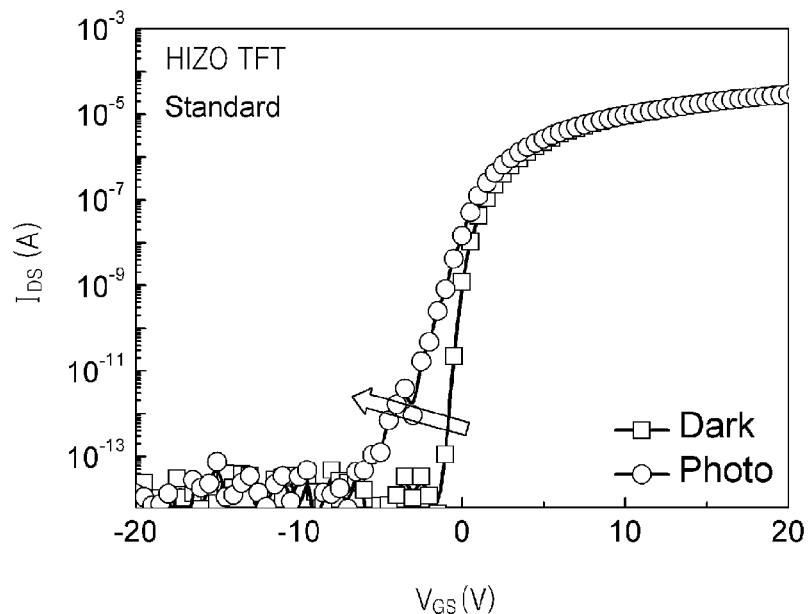
FIG. 5 is a graph illustrating gate voltage ($V_{GS}$)–drain current ($I_{DS}$) characteristics of a transistor of a first comparative example before and after light is irradiated on the transistor.

FIG. 5 is a graph of drain current ($I_{DS}$) versus gate voltage ($V_{GS}$) illustrating characteristics of a transistor according to a first comparative example before and after light is irradiated on the transistor. The transistor used to obtain the graph shown in FIG. 5 does not include the back channel region 20. Rather, the channel layer is formed of HfInZnO having a single layer structure with a uniform composition ratio. Content (amounts) of metal elements of the channel layer having the single layer structure are shown in Table 2. A total thickness of the channel layer of the transistor of the first comparative example is the same as that of the transistor of FIG. 4. A temperature used for annealing and a condition for irradiating light are the same as those for the transistor of FIG. 4.

TABLE 2

| First comparative example | In content (at %) | Hf content (at %) | Zn content (at %) |
| --- | --- | --- | --- |
| Single-layer channel (standard) | 35 | 10 | 55 |

Referring to FIG. 5, a plot for the case (Photo) where light is irradiated on the transistor is shifted left relative to the plot for the case (Dark) where light is not irradiated on the transistor. In more detail, a lower portion of the plot (Photo), which corresponds to a sub-threshold voltage region, is shifted to the left. As shown in FIG. 5, when an entire channel layer has a uniform composition (e.g., the composition of Table 2) without the back channel region 20 having a relative small In content, the characteristics of a transistor change relatively easily in response to light.

Moreover, when an entire channel layer has a uniform composition (e.g., the composition of Table 2), indium (In) may precipitate to the surface (e.g., an upper surface) of the channel layer during formation or during a subsequent process. As a result, the In content and carrier concentration may increase at the surface (upper surface) of the channel layer. Because the upper surface of the channel layer is farther from a gate than a lower surface of the channel layer, the upper surface of the channel layer affects the sub-threshold voltage. As the carrier concentration on the upper surface of the channel layer increases, a photocurrent generated by light increases and the gate voltage ($V_{GS}$)–drain current ($I_{DS}$) characteristics are distorted relatively easily. In more detail, in the graph of drain current ($I_{DS}$) versus gate voltage ($V_{GS}$), a portion corresponding to a sub-threshold voltage is distorted relatively easily. Thus, as shown in FIG. 5, the graph of drain current ($I_{DS}$) versus gate voltage ($V_{GS}$) illustrating characteristics of the transistor become distorted in response to irradiating light on the transistor.

According to at least some example embodiments, however, the compositions of the front channel region 10 and the back channel region 20 are different. As a result, the electrical conductivity and/or carrier concentration of the back channel region 20 is reduced so that generation of photocurrent may be suppressed and/or prevented and/or changes in characteristics of a transistor due to light may be suppressed and/or prevented.

If the In content is reduced (or the Hf content is increased) in an entire channel layer, carrier mobility of the channel layer may also decrease. According to at least some example embodiments, however, the change (e.g., deterioration) in characteristics of a transistor due to light may be suppressed and/or prevented while maintaining relatively high carrier mobility by reducing the In content or increasing the Hf content only in the back channel region 20 of the channel layer.

The above-described mechanism for generating a photocurrent or the above-described principle for improving the characteristics of a transistor are just an example, and thus, another mechanism and another principle may exist.

Figure 6:
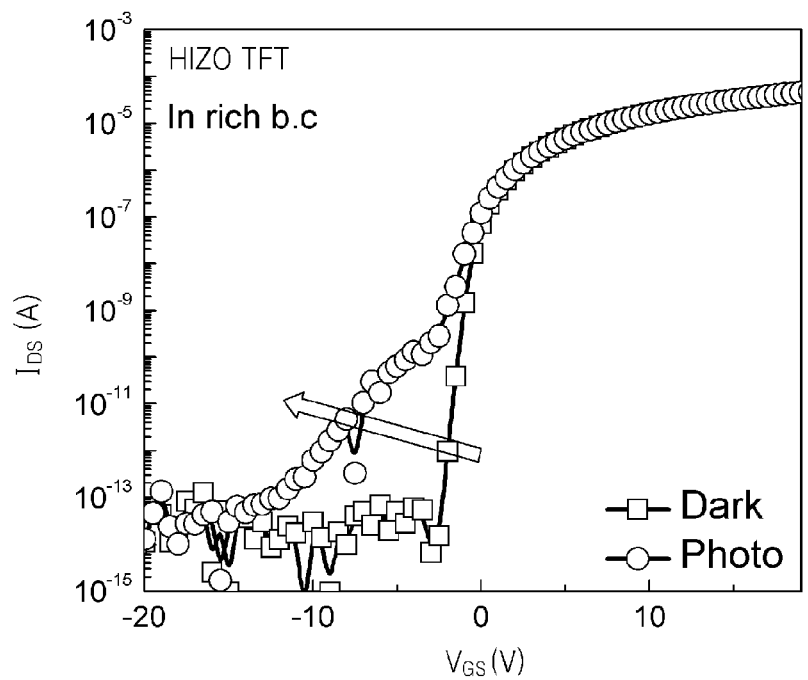
FIG. 6 is a graph illustrating gate voltage ($V_{GS}$)–drain current ($I_{DS}$) characteristics of a transistor of a second comparative example before and after light is irradiated on the transistor.

FIG. 6 is a graph of drain current ($I_{DS}$) versus gate voltage ($V_{GS}$) illustrating characteristics of a transistor according to a second comparative example before and after light is irradiated on the transistor. The transistor used in FIG. 6 is the same as the transistor of FIG. 2, except that the back channel region 20 has an In-rich composition. In this case, compositions of a front channel region and a back channel region of the channel layer formed of HfInZnO are shown in Table 3. A temperature used for annealing and a condition for irradiating light are the same as those for the transistor of FIG. 4.

TABLE 3

| Second comparative example | In content (at %) | Hf content (at %) | Zn content (at %) |
| --- | --- | --- | --- |
| Front channel (standard) | 35 | 10 | 55 |
| Back channel (In rich) | 55 | 10 | 35 |

Referring to FIG. 6, the difference between a plot for the case (Photo) where light is irradiated on the transistor and a plot for the case (Dark) where light is not irradiated on the transistor is greater than in FIG. 5, which indicates that a change in characteristics of a transistor due to light increases when In content of the back channel region is greater than that of the front channel region of the channel layer.

Figure 7:
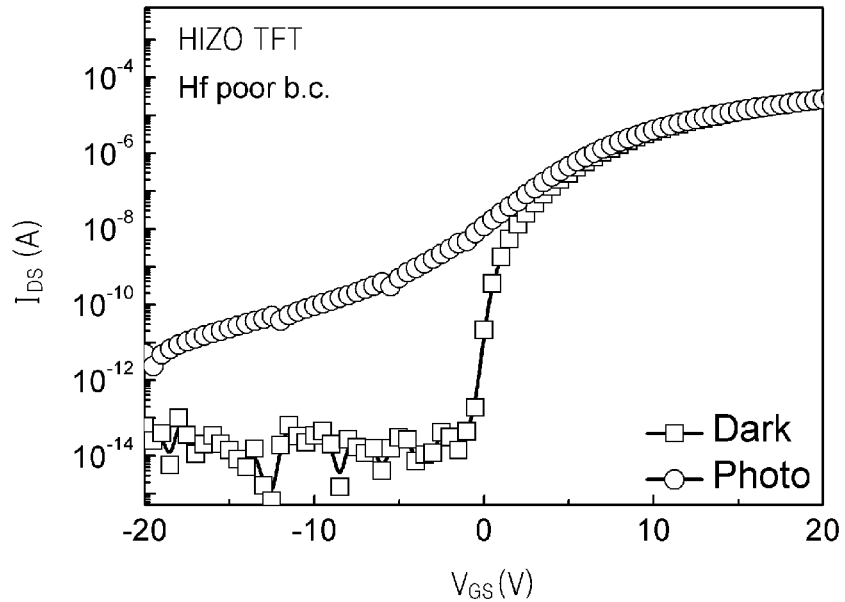
FIG. 7 is a graph illustrating gate voltage ($V_{GS}$)–drain current ($I_{DS}$) characteristics of a transistor of a third comparative example before and after light is irradiated on the transistor.

FIG. 7 is a graph of drain current ($I_{DS}$) versus gate voltage ($V_{GS}$) illustrating characteristics of a transistor according to a third comparative example before and after light is irradiated on the transistor. The transistor used in FIG. 7 is the same as the transistor of FIG. 2, except that the back channel region 20 has a Hf-poor composition. In this case, compositions of a front channel region and a back channel region of the channel layer formed of HfInZnO are shown in Table 4. A temperature used for annealing and a condition for irradiating light are the same as those for the transistor of FIG. 4.

TABLE 4

| Third comparative example | In content (at %) | Hf content (at %) | Zn content (at %) |
| --- | --- | --- | --- |
| Front channel (standard) | 35 | 10 | 55 |
| Back channel (Hf poor) | 47 | 6 | 47 |

Referring to FIG. 7, characteristics of the graph change substantially in response to irradiated light, which indicates that when a Hf content of the back channel region is less than that of the front channel region, the change in characteristics of a transistor due to light increases. Thus, contrary to the third comparative example exhibiting the results shown in FIG. 7, the change in characteristics of a transistor due to light may be reduced by increasing the Hf content of the back channel region compared to that of the front channel region. That is, for example, a back channel region with a greater Hf content than the front channel region may improve the optical reliability of a transistor.

Figure 8:
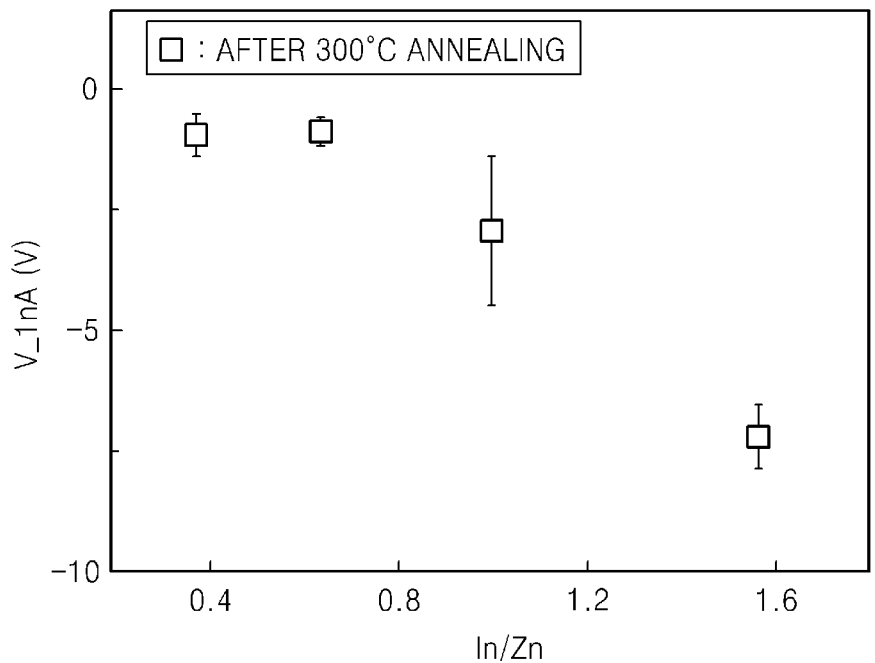
FIG. 8 is a graph illustrating example influence of an annealing temperature according to a ratio of In/Zn of a back channel region of the transistor of FIG. 2.

FIG. 8 is a graph illustrating an example influence of an annealing temperature according to a ratio of In/Zn of the back channel region 20 of the example embodiment shown in FIG. 2. The transistor used to obtain the data displayed in FIG. 8 is the transistor of FIG. 2. In this example, the channel layer C1 is formed of HfInZnO. The contents (amounts) of metallic components of the front channel region 10 are the same as those shown in Table 1. The annealing temperature was about 300° C. In FIG. 8, the Y-axis "V__1nA" represents a gate voltage that allows current of 1 nA to flow between a source electrode and a drain electrode. When "V__1nA" is measured, a voltage of about 10 V is applied to the drain electrode, and about 0 V is applied to the source electrode. As an absolute value of the "V__1nA" increases, a change in characteristics of a transistor due to annealing also increases.

Referring to FIG. 8, when the ratio of In/Zn of the back channel region 20 is about 1.0 or more (e.g., when an In content increases to at least a given, desired or predetermined critical value), the absolute value of the "V__1nA" increases. As the ratio of In/Zn is increased to about 1.0 or more, the "V__1nA" increases (e.g., remarkably or substantially) in the negative (−) direction. Thus, as the In content of the back channel region 20 increases, a change in characteristics of a transistor due to heat also increases. In other words, for example, as the In content of the back channel region 20 is reduced, the change in characteristics of a transistor due to heat is also reduced. Thus, when the back channel region 20 of In-poor composition is used, as in at least some example embodiments, the thermal stability of a transistor may improve.

As described above, according to at least some example embodiments, a transistor having improved optical reliability and/or thermal stability, and improved performance (e.g., relatively high mobility, etc.) may be realized.

Figure 9:
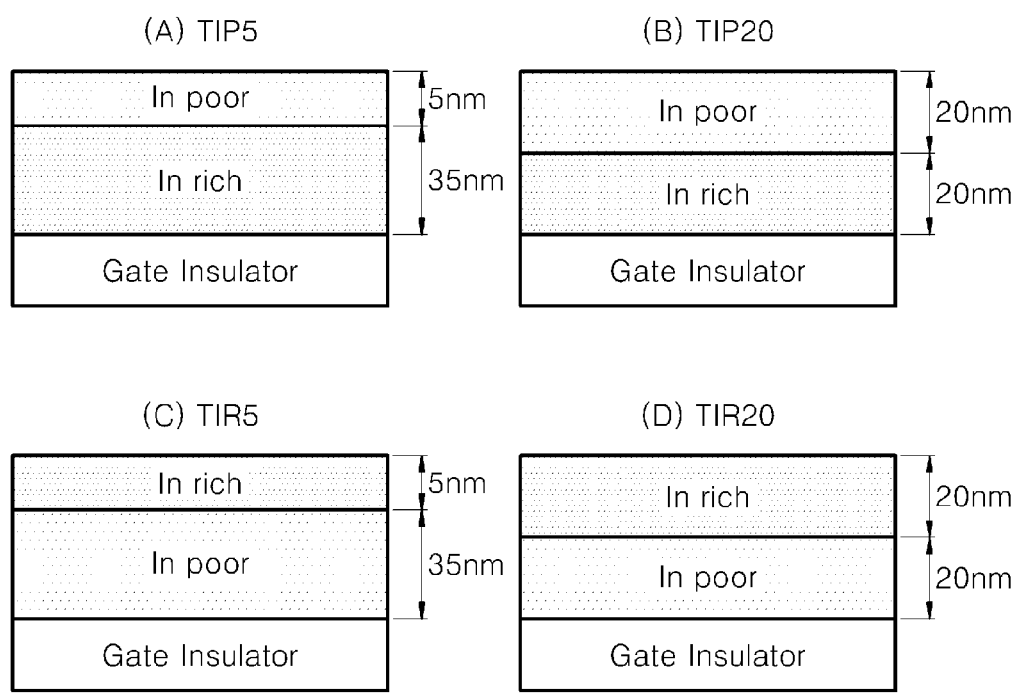
FIGS. 9A and 9B are cross-sectional views showing structures of channel layers of transistors according to example embodiments.
FIGS. 9C and 9D are cross-sectional views showing structures of channel layers of transistors of comparative examples.

FIGS. 9A and 9B are cross-sectional views showing example structures of channel layers of transistors according to example embodiments. FIGS. 9C and 9D are cross-sectional views showing structures of channel layers of transistors according to comparative examples. Transistors including the channel layers shown in FIGS. 9A and 9B and transistors including the channel layers shown in FIGS. 9C and 9D have structures similar to the structure of the transistor of FIG. 2, but are different from each other in terms of the structure of the channel layer. Each of the channel layers of FIGS. 9A through 9D is formed of HfInZnO.

Referring to FIGS. 9A and 9B, each of the channel layers includes an In-poor back channel region and an In-rich front channel region.

In FIG. 9A, the channel layer is denoted "TIP5". The thickness of the back channel region is about 5 nm and the thickness of the front channel region is about 35 nm.

In FIG. 9B, the channel layer is denoted "TIP20". The thickness of the back channel region is about 20 nm and the thickness of the front channel region is also about 20 nm.

Referring to FIGS. 9C and 9D, each of the channel layers includes an In-rich back channel region and an In-poor front channel region. In FIG. 9C, the channel layer is denoted "TIR5". The thickness of the back channel region is about 5 nm and the thickness of the front channel region is 35 nm.

In FIG. 9D, the channel layer is denoted "TIR20". The thickness of the back channel region is about 20 nm and the thickness of the front channel region is 20 nm.

Compositions of the In-poor regions and the In-rich regions in FIGS. 9A through 9D are shown in Table 5 below.

TABLE 5

| | Composition | | | Carrier |
| --- | --- | --- | --- | --- |
| | In content (at %) | Hf content (at %) | Zn content (at %) | concentration (/cm$^3$) |
| In poor | 25 | 10 | 65 | $1.1 \times 10^{14}$ |
| In rich | 55 | 10 | 35 | $3.0 \times 10^{17}$ |

Hereinafter, a transistor including the channel layer "TIP5" shown in FIG. 9A is referred to as "TIP5 transistor", whereas a transistor including the channel layer "TIP20" shown in FIG. 9B is referred to as "TIP20 transistor". In addition, a transistor including the channel layer "TIR5" of FIG. 9C is referred to as "TIR5 transistor", and a transistor including the channel layer "TIR20" of FIG. 9D is referred to as "TIR20 transistor".

Figure 10:
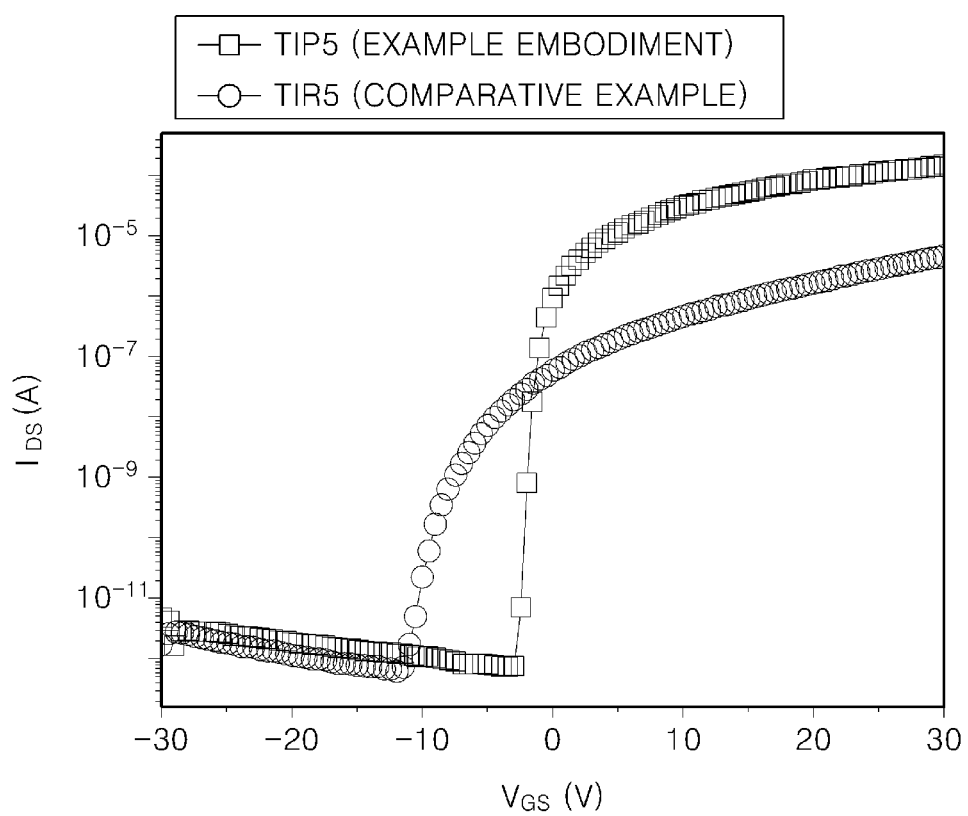
FIG. 10 is a graph illustrating example gate voltage ($V_{GS}$)–drain current ($I_{DS}$) characteristics of the TIP5 transistor (an example embodiment) of FIG. 9A and the TIR5 transistor (a comparative example) of FIG. 9C.

FIG. 10 is a graph of drain current ($I_{DS}$) versus gate voltage ($V_{GS}$) illustrating characteristics of the TIP5 transistor and the TIR5 transistor.

Referring to FIG. 10, an on-current of the TIP5 transistor is higher than that of the TIR5 transistor by about 2 orders (e.g., $10^2$). In addition, a plot for a threshold voltage of the TIP5 transistor is shifted right relative to a plot for a threshold voltage of the TIR5 transistor. The threshold voltage of the TIP5 transistor is about 0 V, whereas the threshold voltage of the TIR5 transistor is about −10V. Thus, a transistor (such as the TIP5 transistor) according to an example embodiment has improved switching characteristics compared to a transistor (the TIR5 transistor) according to a comparative example.

Figure 11:
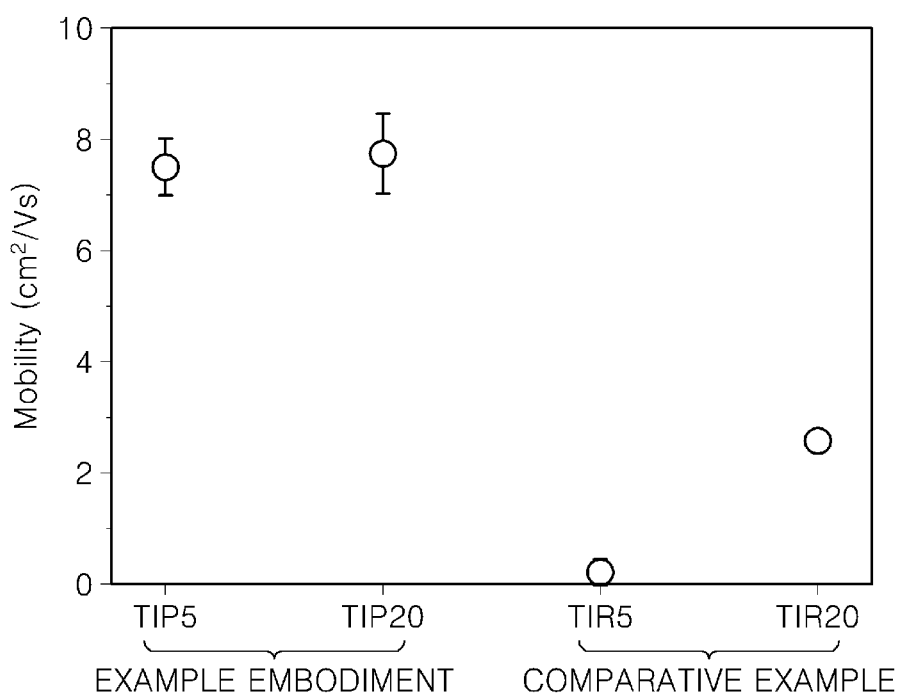
FIG. 11 is a graph illustrating example mobilities of the TIP5, TIP20, TIR5 and TIR20 transistors of FIGS. 9A through 9D, respectively.
Figure 12:
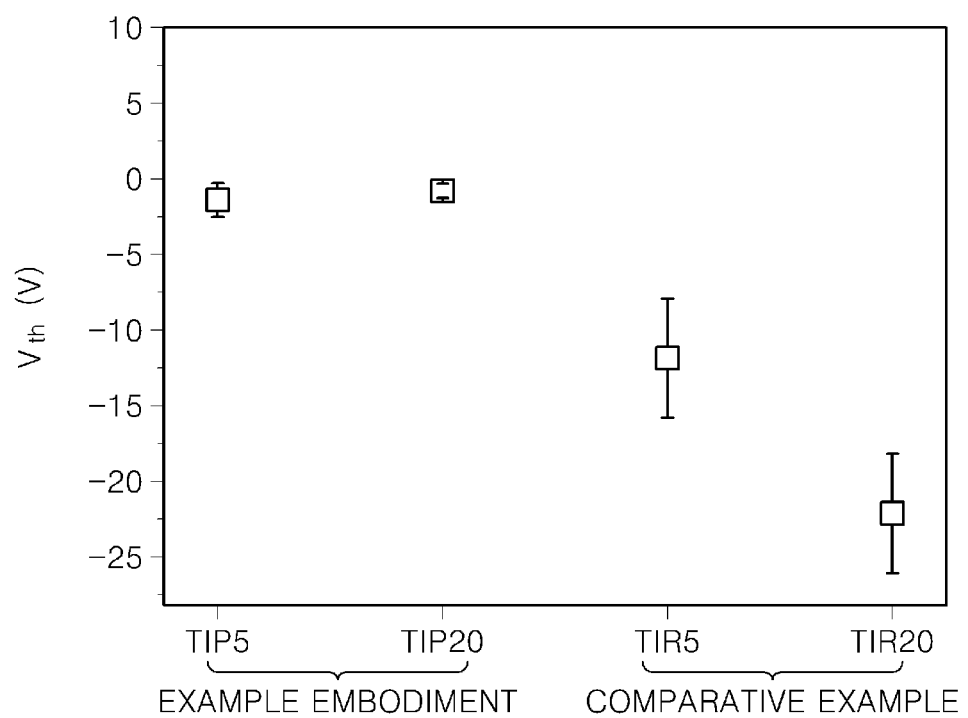
FIG. 12 is a graph illustrating example threshold voltages of the TIP5, TIP20, TIR5 and TIR20 transistors of FIGS. 9A through 9D, respectively.

FIG. 11 is a graph illustrating example mobilities of the TIP5, TIP20, TIR5 and TIR20 transistors discussed above with regard to FIGS. 9A through 9D. FIG. 12 is a graph illustrating example threshold voltages $V_{th}$ of the TIP5, TIP20, TIR5 and TIR20 transistors discussed above with regard to FIGS. 9A through 9D.

Referring to FIG. 11, the mobility of each of the TIP5 and TIP20 transistors is higher (e.g., substantially higher) than the mobility of the TIR5 and TIR20 transistors. The TIP5 transistor and the TIP20 transistor have similar mobility, but the TIR5 transistor and the TIR20 have significantly different mobility from each other.

Referring to FIG. 12, threshold voltages of the TIP5 and TIP20 transistors according to example embodiments are higher than the threshold voltages of the TIR5 and TIR20 transistors according to comparative examples. The threshold voltages of the TIP5 transistor and the TIP20 transistor are similar, but the threshold voltages of the TIR5 transistor and the TIR20 transistor are significantly different.

Figure 13:
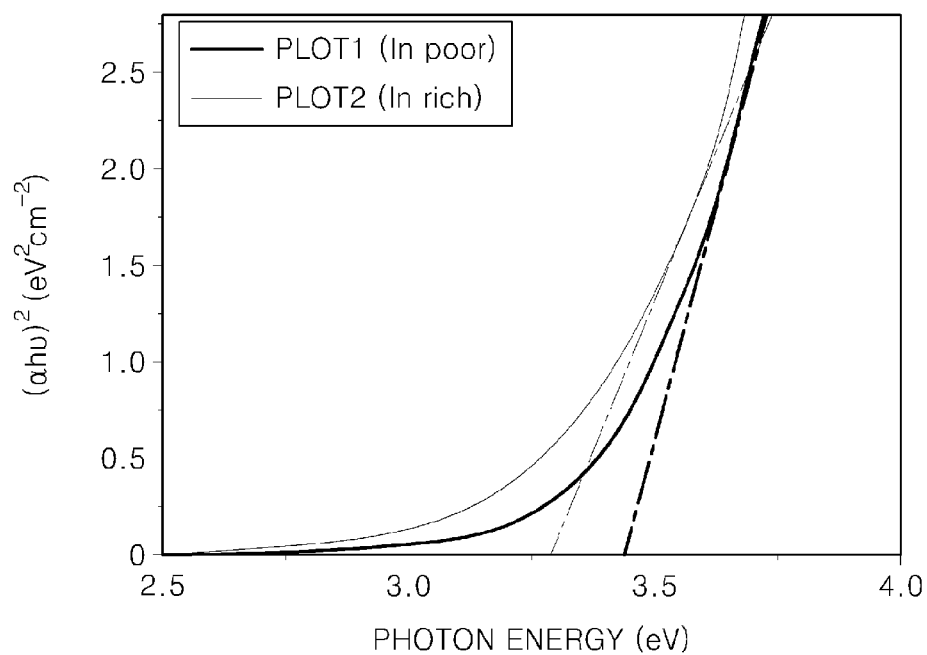
FIG. 13 is a graph illustrating example changes in a $(\alpha h\cup)^2$ value according to a photon energy of an In-poor thin film and an In-rich thin film.

FIG. 13 is a graph illustrating changes in a $(\alpha h\cup)^2$ value according to a photon energy of an In-poor thin film and an In-rich thin film. Here, a is an absorption coefficient and hu is the photon energy. FIG. 13 shows a measurement result of an ultraviolet-visible spectroscopy (UV-VIS). A first plot PLOT1 is related to the In-poor thin film, whereas a second plot PLOT2 is related to the In-rich thin film. In this case, compositions of the In-poor thin film and the In-rich thin film are the same as those in Table 5.

Referring to FIG. 13, the first graph PLOT1 is shifted to the right relative to the second plot PLOT2, and the $(\alpha h\cup)^2$ value of the first plot PLOT1 is smaller than the $(\alpha h\cup)^2$ value of the second plot PLOT2 with respect to the same photon energy, which indicates that light absorbance of the In-poor thin film corresponding to the first plot PLOT1 is lower than the light absorbance of the In-rich thin film corresponding to the second plot PLOT2. Thus, generation of a photocurrent may be suppressed and/or prevented by using the In-poor thin film in a back channel region. On the other hand, when the In-rich thin film is used in a back channel region, the generated photocurrent may increase.

In FIG. 13, photon energies of points where tangent lines of the first and second plots PLOT1 and PLOT2 meet the X-axis correspond to energy band gaps of the In-poor thin film and the In-rich thin film, respectively. The energy band gap of the In-poor thin film corresponding to the first plot PLOT1 is greater than the energy band gap of the In-rich thin film corresponding to the second plot PLOT2. Similarly, the light absorbance of the In-poor thin film is lower than that of the In-rich thin film because the energy band gap of the In-poor thin film is greater than the energy band gap of the In-rich thin film.

Figure 14:
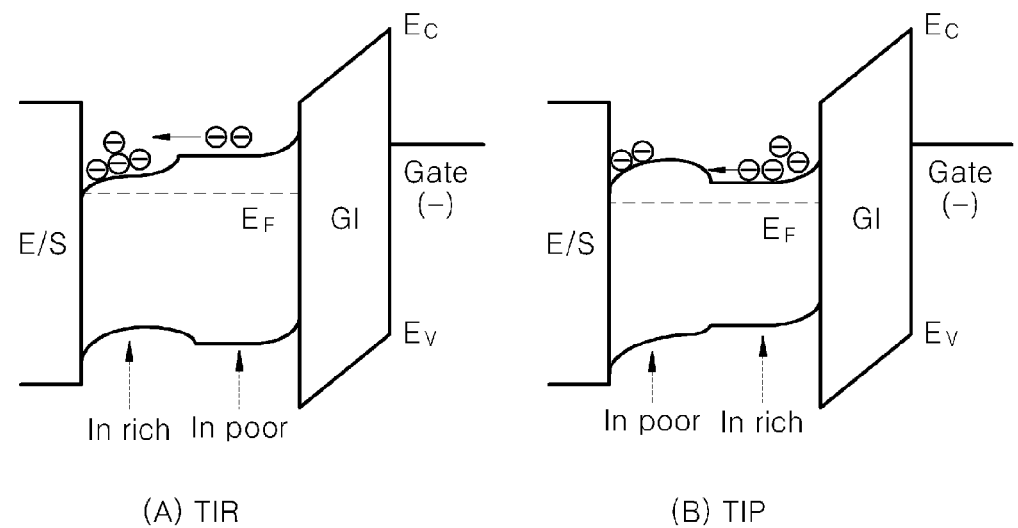
FIGS. 14A and 14B show example energy band diagrams of main components of the TIR20 transistor (a comparative example) of FIG. 9D and the TIP20 transistor (an example embodiment) of FIG. 9B, respectively.

FIG. 14A shows an energy band diagram of main components of the TIR20 transistor of FIG. 9D. FIG. 14B shows an energy band diagram of main components of the TIP20 transistor of FIG. 9B. In FIGS. 14A and 14B, reference marks $E_C$ denotes a minimum energy level of a conduction band, whereas $E_V$ denotes a maximum energy level of a valence band. Reference mark $E_F$ denotes the Fermi energy level. In addition, reference mark G1 denotes a gate insulating layer, and a reference mark E/S denotes an etch stop layer.

Referring to FIG. 14A, with regard to the TIR20 transistor, carriers (electrons) of the front channel region may be more easily introduced into the back channel region because the energy $E_C$ of a back channel region (an In-rich region) is lower than the energy $E_C$ of a front channel region (an In-poor region). Thus, a current path (a conductive path) having relatively high electrical conductivity may be formed in the back channel region that contacts the etch stop layer E/S, thereby increasing a photocurrent.

Referring to FIG. 14B, with regard to the TIP20 transistor, introduction of carriers (electrons) of the front channel region into the back channel region is suppressed relative to the comparative examples because an energy $E_C$ of a back channel region (an In-poor region) is higher than an energy $E_C$ of a front channel region (an In-rich region), thereby suppressing and/or preventing generation of a photocurrent.

Methods of manufacturing transistors according to example embodiments are described below.

FIGS. 15A through 15D are cross-sectional views illustrating a method of manufacturing a transistor according to an example embodiment. The transistor described with regard to FIGS. 15A through 15D is a bottom gate-type transistor such as the transistor shown in FIG. 1. In FIGS. 1 and 15A through 15D, like reference numerals denote like elements.

Figure 15A:
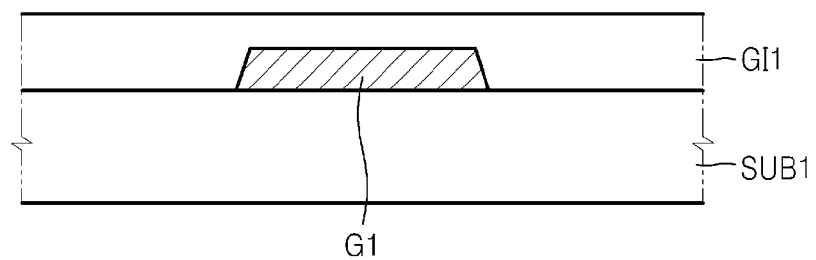
FIGS. 15A through 15D are cross-sectional views of a method of manufacturing a transistor according to an example embodiment.

Referring to FIG. 15A, a gate G1 is formed on a substrate SUB1 and a gate insulating layer GI1 is formed on the substrate SUB1 to cover the gate G1. The substrate SUB1 may be a glass substrate, a plastic substrate, a silicon substrate, or any substrate used to manufacture a semiconductor device. The gate G1 may be formed of an electrode material (e.g., a metal, a conductive oxide, or the like). The gate insulating layer GI1 may be a silicon oxide layer, a silicon oxynitride layer, a silicon nitride layer, or another material layer such as a high-k dielectric material having a dielectric constant higher than the silicon nitride layer. The gate insulating layer GI1 may have a stack layer including at least two selected from the silicon oxide layer, the silicon oxynitride layer, the silicon nitride layer, and the high-k dielectric material layer.

Figure 15B:
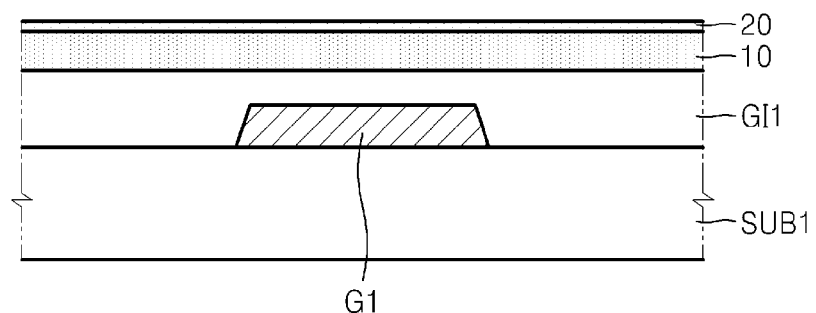

Referring to FIG. 15B, an oxide thin film for a channel including a multi-layered structure (a multi-region structure) is formed on the gate insulating layer GI1. In one example, a first oxide layer 10 (hereinafter, referred to as a first layer or first material layer 10) and a second oxide layer 20 (hereinafter, referred to as a second layer or second material layer 20) are formed sequentially on the gate insulating layer GI1. The first layer 10 may be formed of an oxide semiconductor from the same group as the second layer 20. For example, the first layer 10 and the second layer 20 may be formed of HfInZnO. In this example, the first layer 10 and the second layer 20 may be formed to have different electrical characteristics. For example, the second layer 20 may be formed to have a lower electrical conductivity than that of the first layer 10 and/or a carrier concentration of the second layer 20 may be lower than that of the first layer 10. The first layer 10 and the second layer 20 may have different metal composition ratios by using a method in which the first layer 10 and the second layer 20 are formed to have different characteristics. For example, the second layer 20 may be formed to contain a smaller amount of indium (In) than the first layer 10 and/or the second layer 20 may be formed to include a greater amount of Hf than the first layer 10. The In content of the second layer 20 may be between about 10 at % and about 30 at %, inclusive, and the Hf content of the second layer 20 may be between about 3 at % and about 20 at %, inclusive, based on the metallic components of the second layer 20. A Zn content of the second layer 20 may be between about 50 at % and about 87 at %, inclusive, based on the metallic components of the second layer 20.

The In content is given by [In/(Hf+In+Zn)]×100, the Hf content is given by [Hf/(Hf+In+Zn)]×100, and the Zn content is given by [Zn/(Hf+In+Zn)]×100. An In content of the first layer 10 may be greater than that of the second layer 20, and a Hf content of the first layer 10 may be less than that of the second layer 20.

The first layer 10 and the second layer 20 may be formed using a physical vapor deposition (PVD) method, such as a sputtering method or an evaporation method. When the first layer 10 and the second layer 20 are formed using a sputtering method, the source power for at least one target for forming the second layer 20 may differ from that for forming the first layer 10 if a plurality of targets (e.g., an In target, a Hf target, a Zn target, or the like) are used. For example, the source power for the In target during formation of the second layer 20 may be lower than source power for the In target during formation of the first layer 10, and thus, the In content of the second layer 20 may be lower than that of the first layer 10. In addition, the source power for the Hf target during formation of the second layer 20 may be higher than the source power for the Hf target during formation of the first layer 10, and thus, a Hf content of the second layer 20 may be higher than that of the first layer 10.

Alternatively, when the first layer 10 and the second layer 20 are formed, different HfInZnO targets may be used. For example, a first HfInZnO target may be used for the first layer 10, and a second HfInZnO target having a different metal composition ratio from the first HfInZnO target may be used for the second layer 20. In this example, the first layer 10 and the second layer 20 may be formed to have different metal composition ratios. When the first layer 10 and the second layer 20 are formed using an evaporation method, the first layer 10 and the second layer 20 may be formed to have different metal composition ratios by controlling the source power.

The first layer 10 and the second layer 20 may be formed by using a method other than the above-described PVD method, such as a chemical vapor deposition (CVD) method or an atomic layer deposition (ALD) method. When the first layer 10 and the second layer 20 are formed using the CVD method, the first layer 10 and the second layer 20 may have different composition ratios by controlling a flow ratio of a precursor gas. When the first layer 10 and the second layer 20 are formed by using the ALD method, the first layer 10 and the second layer 20 may have different composition ratios by controlling the number of deposition cycles. In addition, the first layer 10 and the second layer 20 may be formed by using various methods.

A thickness of the first layer 10 may be between about 10 nm and about 100 nm, inclusive. The second layer 20 may be thinner than the first layer 10. For example, the second layer 20 may be formed to have a thickness of between about 1 nm and about 40 nm, inclusive. In another example, the second layer 20 may be formed to have a thickness between about 1 nm and about 20 nm, inclusive. However, the thickness ranges discussed above are merely examples, and may be changed if necessary.

Figure 15C:
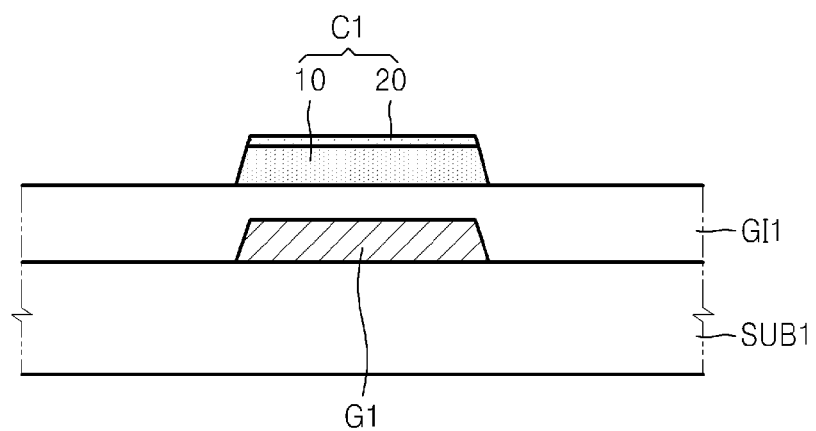

As illustrated in FIG. 15C, a channel layer C1 is formed by pattering the second layer 20 and the first layer 10. The patterned first layer 10 may be the same as the front channel region 10 of FIG. 1, and the patterned second layer 20 may be the same as the back channel region 20 of FIG. 1.

Figure 15D:
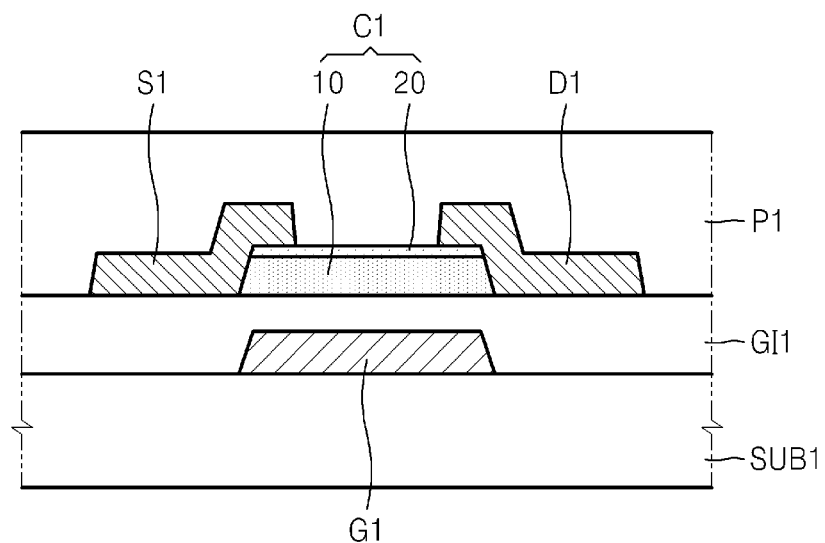

Referring to FIG. 15D, a source electrode S1 is formed on the gate insulating layer GI1 to contact a first end or outer portion of the channel layer C1, and a drain electrode D1 is formed on the gate insulating layer GI1 to contact second end or outer portion of the channel layer C1. A middle portion of an upper surface of the channel layer C1 is left exposed. In more detail, the source electrode S1 and the drain electrode D1 are formed in the manner shown and described with regard to FIG. 1. Each of the source electrode S1 and the drain electrode D1 may have a single layer or a multi-layer structure.

A passivation layer P1 is then formed above the substrate SUB1 to cover the exposed portion of the channel layer C1, the source electrode S1 and the drain electrode D1. The passivation layer P1 may be, for example, a silicon oxide layer, a silicon oxynitride layer, a silicon nitride layer, an organic layer, or may have a stack structure including at least two of the silicon oxide layer, the silicon oxynitride layer, the silicon nitride layer and the organic layer. The transistor formed using the above-described method may be annealed at a given, desired or predetermined temperature, for example, between about 250° C. and about 400° C., inclusive.

The transistor of FIG. 2 may be manufactured by using a method similar to the method described with reference to FIGS. 15A through 15D, except that the etch stop layer ES1 is formed on the channel layer C1 and the source electrode S12 and the drain electrode D12 are formed as discussed above with regard to FIG. 2. The method of manufacturing the transistor of FIG. 2 may be known by one of ordinary skill in the art, based on the method described with reference to FIGS. 15A through 15D, and thus, is not described in detail.

FIGS. 16A through 16D are cross-sectional views illustrating a method of manufacturing a transistor according to another example embodiment. The transistor described with regard to FIGS. 16A through 16D is a top gate-type transistor as shown in FIG. 3. In FIGS. 3 and 10A through 10D, like reference numerals denote like elements.

Figure 16A:
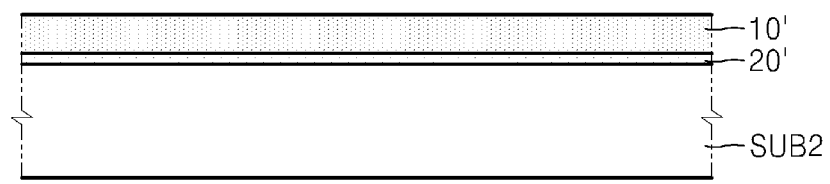
FIGS. 16A through 16D are cross-sectional views of a method of manufacturing a transistor according to another example embodiment.

Referring to FIG. 16A, an oxide thin film for a channel including a multi-layer structure (a multi-region structure) is formed on a substrate SUB2. For example, a second oxide layer 20' (hereinafter, referred to as a second layer or second material layer 20') and a first oxide layer 10' (hereinafter, referred to as a first layer or first material layer 10') are formed sequentially on the substrate SUB2. The first layer 10' and the second layer 20' may be the same or substantially the same material layers as the first layer 10 and the second layer 20 of FIG. 15B, respectively. However, the second layer 20' is formed on the substrate SUB2 and the first layer 10' is formed on the second layer 20'. Materials, forming methods, thicknesses, and the like of the first layer 10' and the second layer 20' may be the same or substantially the same as those of the first layer 10 and the second layer 20 of FIG. 15B.

Figure 16B:
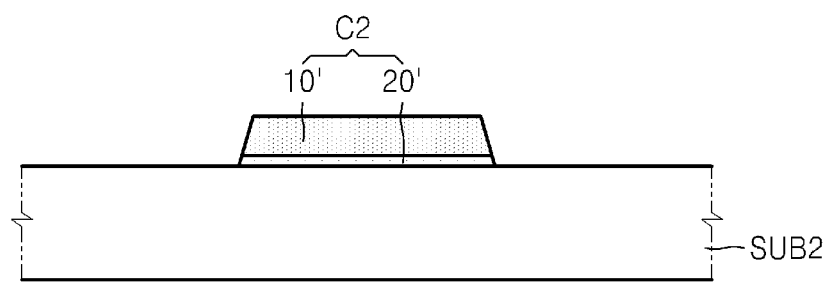

As illustrated in FIG. 16B, a channel layer C2 is formed by patterning the first layer 10' and the second layer 20'. The patterned first layer 10' corresponds to the front channel region 10' of FIG. 3, and the patterned second layer 20' corresponds to the back channel region 20' of FIG. 3. The channel layer C2 of FIG. 16B may be similar to an inverse structure of the channel layer C1 of FIG. 15C.

Figure 16C:
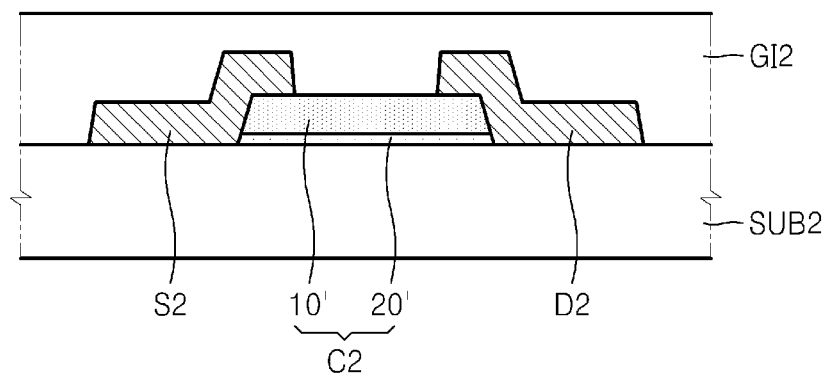

Referring to FIG. 16C, a source electrode S2 is formed on the substrate SUB2 to contact a first end or outer portion of the channel layer C2 and a drain electrode D2 is formed on the substrate SUB2 to contact a second end or outer portion of the channel layer C2. The source electrode S2 and the drain electrode D2 are formed in the manner shown and described with regard to FIG. 3.

A gate insulating layer GI2 is then formed on the substrate SUB2 to cover the channel layer C2, the source electrode S2 and the drain electrode D2. The gate insulating layer GI2 may be formed of a material similar to or the same as that of the gate insulating layer GI1 of FIG. 15A, and may have the same or substantially the same stack structure or an inverse structure of the gate insulating layer GI1.

Figure 16D:
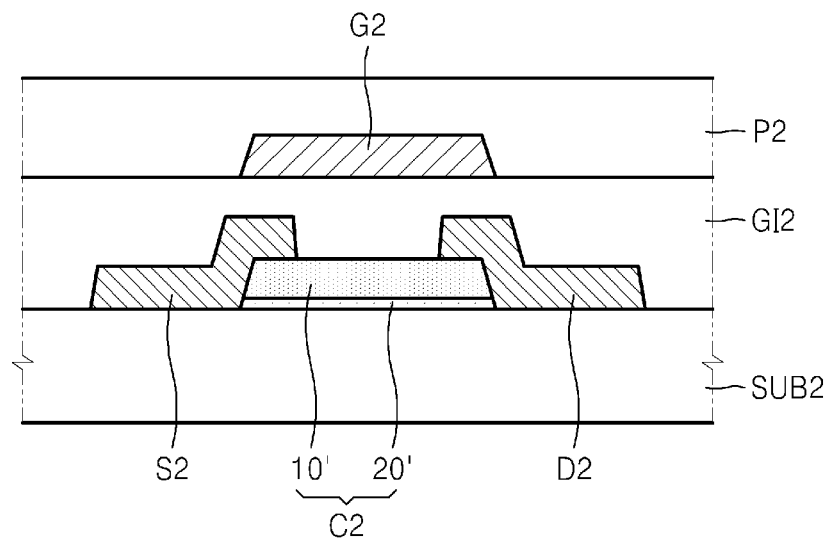

Referring to FIG. 16D, a gate G2 is formed on the gate insulating layer GI2 above the channel layer C2.

A passivation layer P2 is formed on the gate insulating layer GI2 to cover the gate G2. The passivation layer P2 may be formed of the same or a similar material and may have a similar or the same stack structure as that of the passivation layer P1 of FIG. 15D. The transistor formed using the above-described method may be annealed at a given, desired or predetermined temperature, for example, between about 250° C. and about 400° C., inclusive.

Transistors according to one or more example embodiments may be used as switching devices and/or driving devices in flat display devices, such as a liquid crystal display (LCD) apparatuses, organic light emitting display (OLED) devices, and the like. As described above, if transistors are used in flat display devices, the reliability and/or performance of the flat display devices may be increased because the transistor has a relatively small change in characteristics due to light and improved thermal stability. The structure of a liquid crystal display apparatus or an organic light emitting display device is well known, and thus, is not described. Transistors according to at least some example embodiments may also be used in other electronic devices such as memory devices, logic devices, etc.

It should be understood that the example embodiments described herein should be considered in a descriptive sense only and not for purposes of limitation. Descriptions of features or aspects within each embodiment should typically be considered as available for other similar features or aspects in other embodiments. For example, it would be understood that the transistors of FIGS. 1 through 3 may be changed in various forms. In more detail, for example, in the transistors of FIGS. 1 through 3, the source electrodes S1, S12 and S2 and the drain electrodes D1, D12 and D2 contact upper ends or outer portions of the channel layers C1 and C2 respectively. However, the source electrodes S1, S12 and S2 and the drain electrodes D1, D12 and D2 may contact lower ends or outer portions of the channel layers C1 and C2. For example, a channel layer may be formed to contact the source electrode and the drain electrode after forming a source electrode and a drain electrode. In addition, in the transistor, the front channel region (e.g., the first layers 10 and 10') of the channel layers C1 and C2 may include a plurality of layers. In addition, the method of FIGS. 15A through 15D, and the method of FIGS. 16A through 16D may be changed in various forms. Moreover, it would be understood by one of ordinary skill in the art that aspects of example embodiments may be applied to other transistors other than an oxide transistor. Thus, the scope of patent rights may be determined by the claims, and not by the example embodiments discussed herein.

What is claimed is:

1. A method of manufacturing an oxide transistor, the method comprising:
   forming a gate on a substrate;
   forming a gate insulating layer to cover the gate;
   forming a channel layer on the gate insulating layer; and
   forming a source electrode to contact a first end portion of the channel layer, and a drain electrode to contact a second end portion of the channel layer; wherein
      the forming of the channel layer includes, forming a first material layer and a second material layer sequentially on the gate insulating layer,
      the first material layer includes hafnium-indium-zinc-oxide (HfInZnO) and has a first electrical conductivity, the second material layer includes hafnium-indium-zinc-oxide (HfInZnO) and has a second electrical conductivity that is lower than the first electrical conductivity,
      the first material layer is closer to the gate than the second material layer, the first material layer and the second material layer have different metal composition ratios, and
      a zinc content of the second material layer is greater than a zinc content of the first material layer, the zinc content of the second material layer is between about 50 at % and about 87 at % based on the metallic components of the second material layer.

2. The method of claim 1, wherein a thickness of the first material layer and a thickness of the second material layer are different.

3. The method of claim 1, wherein a hafnium (Hf) content of the second material layer is greater than a hafnium (Hf) content of the first material layer.

4. The method of claim 1, wherein the second material layer is formed to have a thickness of between about 1 nm and about 40 nm, inclusive.

5. The method of claim 1, further comprising:
   forming an etch stop layer on the channel layer.

6. The method of claim 1, further comprising:
   annealing the channel layer at a temperature of between about 250° C. and about 400° C., inclusive.

7. A method of manufacturing an oxide transistor, the method comprising:
   forming a channel layer on a substrate;
   forming a source electrode to contact a first end portion of the channel layer, and a drain electrode to contact a second end portion of the channel layer;
   forming a gate insulating layer to cover the channel layer, the source electrode, and the drain electrode; and
   forming a gate on the gate insulating layer; wherein
      the forming of the channel layer includes forming a first material layer and a second material layer sequentially on the substrate, the first material layer includes hafnium-indium-zinc-oxide (HfInZnO) and has a first electrical conductivity,
      the second material layer includes hafnium-indium-zinc-oxide (HfInZnO) and has a second electrical conductivity that is greater than the first electrical conductivity,
      the second material layer is closer to the gate than the first material layer,
      the first material layer and the second material layer have different metal composition ratios, and
      a zinc content of the first material layer is greater than a zinc content of the second material layer, the zinc content of the first material layer is between about 50 at % and about 87 at % based on the metallic components of the first material layer.

8. The method of claim 7, wherein a thickness of the first material layer and a thickness of the second material layer are different.

9. The method of claim 7, wherein a hafnium (Hf) content of the first material layer is greater than a hafnium (Hf) content of the second material layer.

10. The method of claim 7, wherein the first material layer is formed to have a thickness of between about 1 nm and about 40 nm, inclusive.

11. The method of claim 7, further comprising:
    annealing the channel layer at a temperature of between about 250° C. and about 400° C., inclusive.

12. An oxide transistor comprising:
    a channel layer formed of an oxide semiconductor;
    a source electrode contacting a first end portion of the channel layer;
    a drain electrode contacting a second end portion of the channel layer;
    a gate corresponding to the channel layer; and
    a gate insulating layer disposed between the channel layer and the gate; wherein
       the oxide semiconductor includes hafnium-indium-zinc-oxide (HfInZnO),
       an electrical conductivity of a back channel region of the channel layer is lower than an electrical conductivity of a front channel region of the channel layer,
       the front channel region is closer to the gate than the back channel region, the back channel region and the front channel region have different metal composition ratios, and
       a zinc content of the back channel region is greater than a zinc content of the front channel region, the zinc content of the back channel region is between about 50 at % and about 87 at % based on the metallic components of the back channel region.

13. The oxide transistor of claim 12, wherein a carrier concentration of the back channel region is lower than a carrier concentration of the front channel region.

14. The oxide transistor of claim 12, wherein the indium content of the back channel region is between about 10 at % and about 30 at %, inclusive, based on metallic components of the back channel region.

15. The oxide transistor of claim 12, wherein the hafnium content of the back channel region is between about 3 at % and about 20 at %, inclusive, based on metallic components of the back channel region.

16. The oxide transistor of claim 12, wherein the back channel region has a thickness of between about 1 nm and about 40 nm, inclusive.

17. The oxide transistor of claim 12, wherein the gate is disposed below the channel layer.

18. The oxide transistor of claim 12, wherein the back channel region is formed in an upper surface portion of the channel layer.

19. The oxide semiconductor of claim 18, wherein the front channel region is formed in a remaining portion of the channel layer.

20. The oxide transistor of claim 18, further comprising:
an etch stop layer disposed on the channel layer.

21. The oxide transistor of claim 12, wherein the gate is disposed above the channel layer.

22. The oxide transistor of claim 12, wherein the back channel region is formed in a lower surface portion of the channel layer.

23. The oxide transistor of claim 22, wherein the front channel region is formed in a remaining portion of the channel layer.

24. The oxide transistor of claim 12, wherein the channel layer has a multilayer structure including a first material layer formed on a second material layer, and wherein the back channel region is formed in one of the first material layer and the second material layer.

25. The oxide transistor of claim 24, wherein a thickness of the first material layer and a thickness of the second material layer are different.

26. The oxide transistor of claim 24, wherein the back channel region is formed in the first material layer, and the front channel region is formed in the second material layer, and wherein the first material layer has a thickness that is less than a thickness of the second material layer.

27. The oxide transistor of claim 24, wherein the front channel region is formed in the first material layer, and the back channel region is formed in the second material layer, and wherein the first material layer has a thickness that is greater than a thickness of the second material layer.

28. A flat panel display apparatus comprising the oxide transistor of claim 12.

* * * * *